US009900014B2

(12) United States Patent
Tamura

(10) Patent No.: US 9,900,014 B2
(45) Date of Patent: Feb. 20, 2018

(54) FREQUENCY DIVIDING CIRCUIT AND SEMICONDUCTOR INTEGRATED CIRCUIT

(71) Applicant: SOCIONEXT INC., Yokohama-shi, Kanagawa (JP)

(72) Inventor: Tetsuro Tamura, Yokohama (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 15/132,824

(22) Filed: Apr. 19, 2016

(65) Prior Publication Data

US 2016/0233867 A1     Aug. 11, 2016

Related U.S. Application Data

(63) Continuation of application No. PCT/JP2014/071766, filed on Aug. 20, 2014.

(51) Int. Cl.
| | |
|---|---|
| H03M 9/00 | (2006.01) |
| H03K 23/52 | (2006.01) |
| H03K 3/037 | (2006.01) |
| H03K 19/21 | (2006.01) |
| H03K 21/02 | (2006.01) |
| H03K 3/356 | (2006.01) |
| H03K 21/12 | (2006.01) |
| H03K 23/54 | (2006.01) |

(52) U.S. Cl.
CPC ............. *H03K 23/52* (2013.01); *H03K 3/037* (2013.01); *H03K 3/0372* (2013.01); *H03K 3/356026* (2013.01); *H03K 19/21* (2013.01); *H03K 21/026* (2013.01); *H03K 21/12* (2013.01); *H03K 23/54* (2013.01); *H03M 9/00* (2013.01)

(58) Field of Classification Search
CPC ........ H03K 3/037; H03K 3/0372; H03M 9/00
USPC .................................................. 341/100, 101
See application file for complete search history.

(56) References Cited

U.S. PATENT DOCUMENTS

| | | | |
|---|---|---|---|
| 6,259,293 B1 * | 7/2001 | Hayase | H03K 5/135 327/158 |
| 6,373,414 B2 * | 4/2002 | Koga | 341/100 |
| 6,756,832 B2 * | 6/2004 | Reuveni | H03K 5/135 327/271 |
| 7,573,305 B1 * | 8/2009 | Cosand | H03K 23/542 327/113 |

(Continued)

FOREIGN PATENT DOCUMENTS

| | | |
|---|---|---|
| JP | S61-206313 A | 9/1986 |
| JP | S63-051716 A | 3/1988 |

(Continued)

OTHER PUBLICATIONS

ISR and Written Opinion of the International Searching Authority of PCT Patent Application No. PCT/JP2014/071766 dated Oct. 7, 2014, with partial English translation.

(Continued)

*Primary Examiner* — Peguy Jean Pierre
(74) *Attorney, Agent, or Firm* — Arent Fox LLP

(57) ABSTRACT

A plurality of latch circuits driven at rising of a clock signal and a plurality of latch circuits driven at falling of the clock signal are alternately connected, and generation circuit generates a plurality of frequency divided clock signals with different phases based on combinations of levels of outputs of the plurality of latch circuits.

13 Claims, 13 Drawing Sheets

(56) References Cited

U.S. PATENT DOCUMENTS

| | | | | |
|---|---|---|---|---|
| 2001/0030565 | A1* | 10/2001 | Ebuchi | G06F 1/06 327/258 |
| 2002/0174374 | A1* | 11/2002 | Ghaderi | G06F 1/06 713/500 |
| 2006/0233112 | A1* | 10/2006 | Demmerle | H03K 23/425 370/249 |
| 2009/0167373 | A1 | 7/2009 | Song | |
| 2009/0251176 | A1 | 10/2009 | Miller | |
| 2010/0026347 | A1 | 2/2010 | Iizuka | |
| 2010/0134154 | A1* | 6/2010 | He | H03K 23/544 327/115 |

FOREIGN PATENT DOCUMENTS

| | | |
|---|---|---|
| JP | S63-079411 A | 4/1988 |
| JP | S64-050621 A | 2/1989 |
| JP | H04-212521 A | 8/1992 |
| JP | H07-321642 A | 12/1995 |
| JP | H11-251924 A | 9/1999 |
| JP | 2008-199533 A | 8/2008 |
| JP | 2008-545322 A | 12/2008 |
| JP | 2009-524319 A | 6/2009 |
| JP | 2010-028662 A | 2/2010 |
| JP | 2010-041156 A | 2/2010 |

OTHER PUBLICATIONS

Japanese Office Action of related Japanese Patent Application No. 2016-543531 dated Sep. 19, 2017.

* cited by examiner

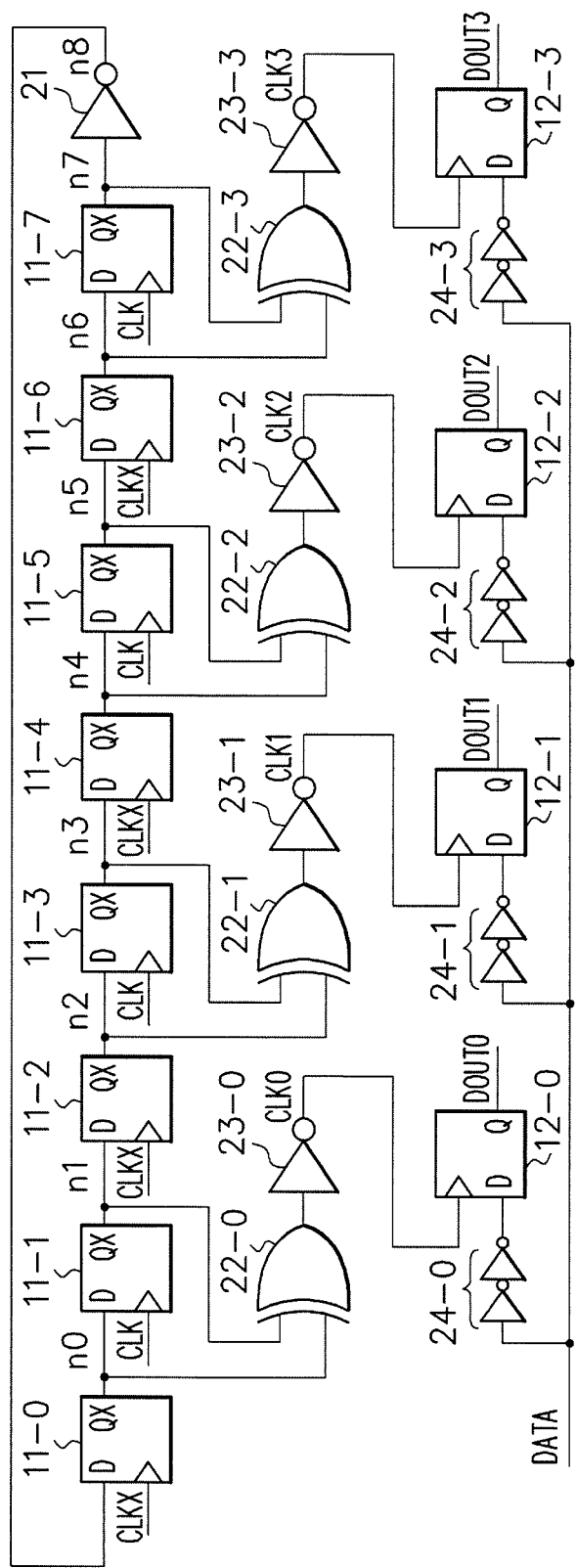
F I G. 1

F I G. 5
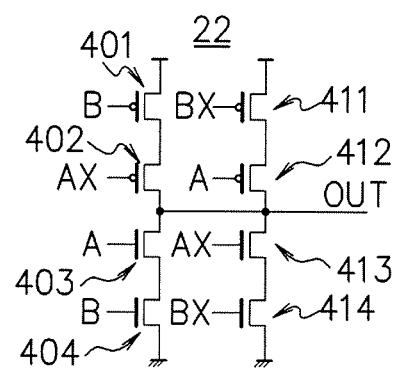

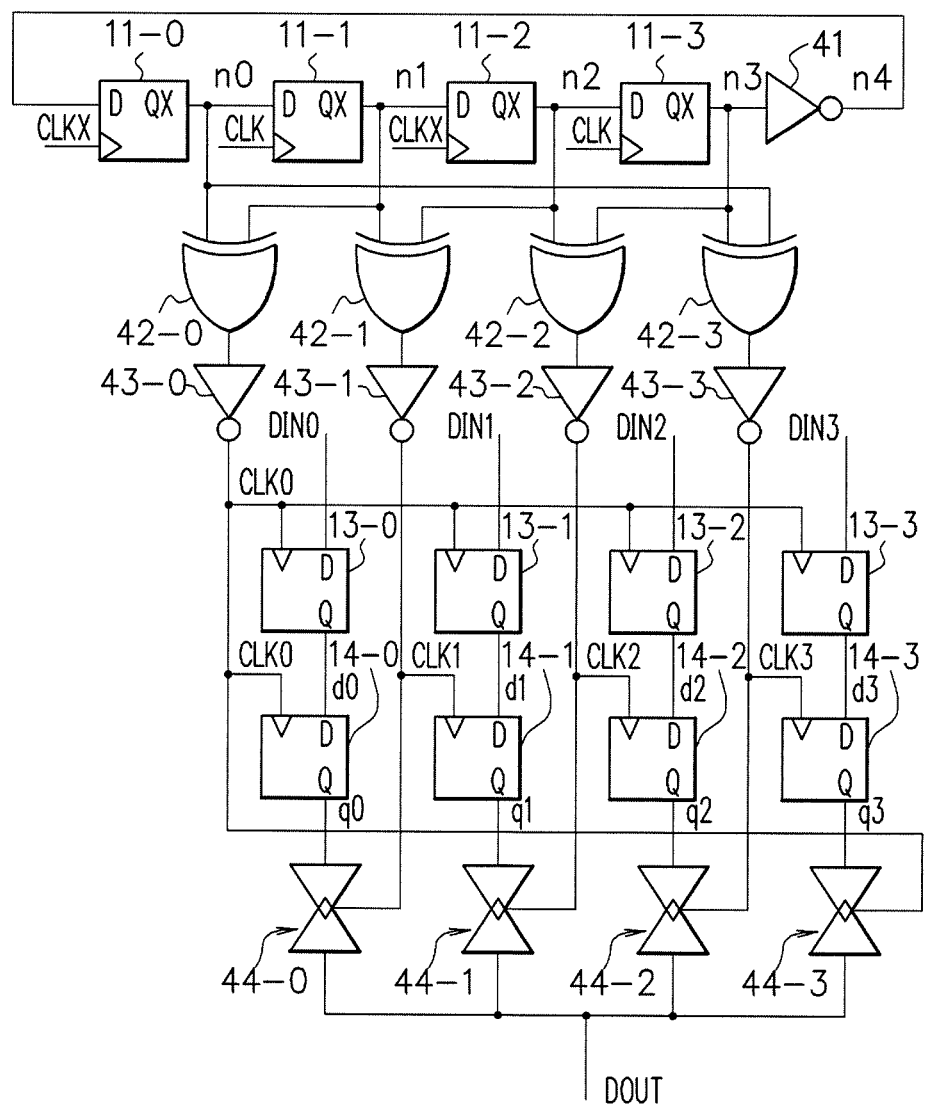
F I G. 9

F I G. 13
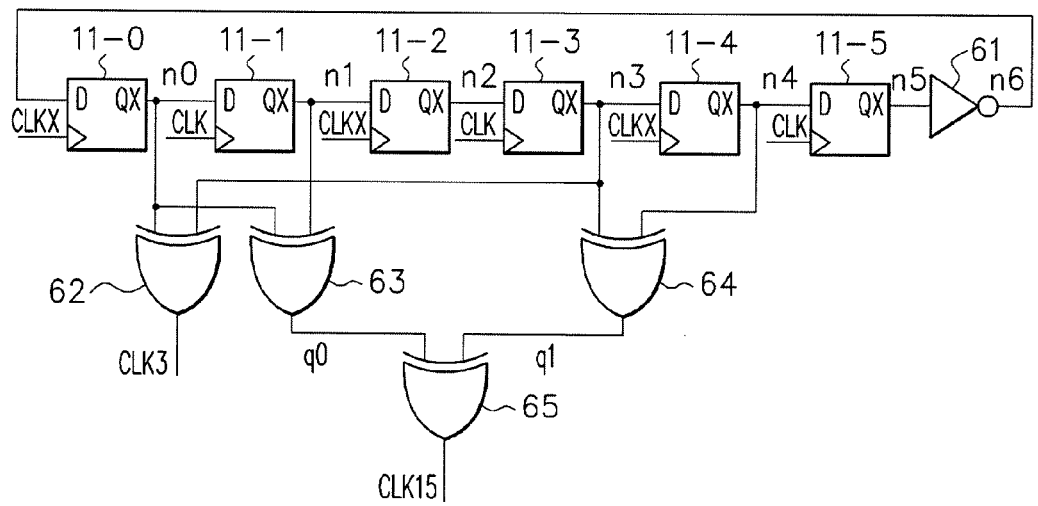
F I G. 14
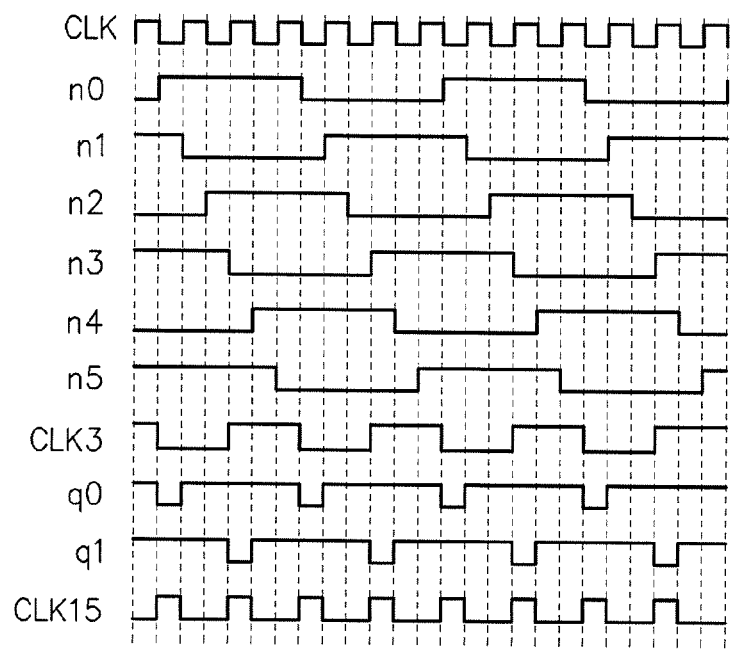

F I G. 17B
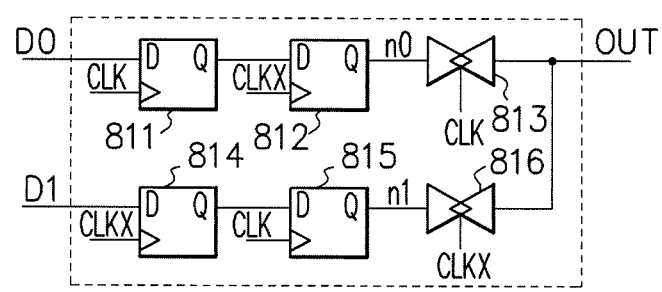
F I G. 17C
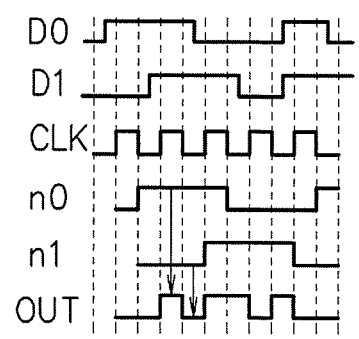

FREQUENCY DIVIDING CIRCUIT AND SEMICONDUCTOR INTEGRATED CIRCUIT

CROSS-REFERENCE TO RELATED APPLICATION

This application is a continuation application of International Application PCT/JP2014/071766 filed on Aug. 20, 2014, and designated the U.S., the entire contents of which are incorporated herein by reference.

FIELD

The embodiments discussed herein are directed to a frequency dividing circuit and a semiconductor integrated circuit.

BACKGROUND

A communication amount is increasing in data communication between information processing devices, and there is a limit in enlarging the number of wiring together with a bit width in parallel data transmission. In order to correspond to an increase in communication amount, there is a case where a serializer/deserializer (SerDes) is mounted on each device to carry out data communication between the devices by serial data transmission.

FIG. 15 is a diagram illustrating a configuration example of a serializer/deserializer. A serializer/deserializer 601 includes a control circuit 602, an oscillation circuit (PLL) 603, a transmission system (TX) circuit, a reception system (RX) circuit, and so on. The transmission system circuit receives parallel data inside a device on which the serializer/deserializer 601 is mounted and converts into serial data by performing parallel-serial conversion by a multiplexer (MUX) 604, thereafter shaping a voltage waveform by a feed forward equalizer (FFE) 605 and outputting to outside the device via a driver 606.

The reception system circuit receives serial data from outside the device via an equalizer 607 and reproduces data and a clock signal by a decision feedback equalizer (DFE) 608 and a clock data recovery (CDR) 609. The reception system circuit converts this data into parallel data by performing serial-parallel conversion by a demultiplexer (DMUX) 610, and outputs to a processor or the like inside the device.

FIG. 16A is a diagram illustrating a configuration example of a conventional demultiplexer used for a serializer/deserializer. FIG. 16A illustrates the demultiplexer which converts serial data inputted to the demultiplexer into 4-bit parallel data, as an example. Note that in the present specification <"signal name" X> or <"signal name" x> is a logically inverting signal (complementary signal) of "signal name" signal.

In FIG. 16A, a 1:2 conversion circuit 701 converts inputted serial data DATA into 2-bit parallel data, by using frequency divided clock signals CLK2, CLK2x outputted from a frequency divider 702. The frequency divided clock signals CLK2, CLK2x are clock signals obtained by frequency-dividing (½ frequency dividing) inputted clock signals CLK, CLKX into twofold cycles.

The 1:2 conversion circuit 701 includes four latch circuits 711, 712, 713, 714 connected as illustrated in FIG. 16B. In each of the latch circuits 711 to 714, a value of an input D is transmitted to an output Q when the inputted clock signal is at a high level, the value of the input D is latched at falling (at a time of transition from the high level to a low level) of the clock signal, and the output Q is held when the clock signal is at the low level. The 1:2 conversion circuit illustrated in FIG. 16B converts serial data DATA which transits in synchronization with the clock signal CLK into 2-bit parallel data D0, D1 which transits in synchronization with the frequency divided clock signal CLK2 which is the twofold cycle of the clock signal CLK, as illustrated in FIG. 16C.

The 1:2 conversion circuits 703, 704 convert data of each bit in 2-bit parallel data having been converted by the 1:2 conversion circuit 701 as serial data into 2-bit parallel data by using the frequency divided clock signals outputted from the frequency divider 705. The frequency divided clock signals outputted from the frequency divider 705 are clock signals obtained by ½ frequency-dividing frequency divided clock signals CLK2, CLK2x. Configurations of the 1:2 conversion circuits 703, 704 are similar to that of the 1:2 conversion circuit 701.

As described above, the conventional demultiplexer ½ frequency-divides the input clock signal, and latches the data by the latch circuit in the 1:2 conversion circuit at falling (or rising) of the frequency divided clock signal, whereby to convert the serial data into 2-bit parallel data. Further, by repeating frequency division of the clock signal and division of the data (conversion from the serial data into the 2-bit parallel data), the conventional demultiplexer generates $2^n$-bit parallel data.

FIG. 17A is a diagram illustrating a configuration example of a conventional multiplexer used for a serializer/deserializer. FIG. 17A illustrates the multiplexer which converts 4-bit parallel data inputted to the multiplexer into serial data, as an example.

In FIG. 17A, a 2:1 conversion circuit 801 converts 2-bit parallel data DIN0, DIN1 in inputted 4-bit parallel data into 1-bit serial data, by using a frequency divided clock signal outputted from a frequency divider 803. A 2:1 conversion circuit 802 converts 2-bit parallel data DIN2, DIN3 in the inputted 4-bit parallel data into 1-bit serial data, by using the frequency divided clock signal outputted from the frequency divider 803. The frequency divided clock signal outputted from the frequency divider 803 is a clock signal obtained by frequency-dividing (½ frequency-dividing) clock signals CLK, CLKX inputted to a 2:1 conversion circuit 804 in a later stage into a twofold cycle.

The 2:1 conversion circuit 804 converts a group of 1-bit serial data each which has been converted by the 2:1 conversion circuits 801, 802, that is, 2-bit parallel data, into 1-bit serial data DOUT, by using the inputted clock signals CLK, CLKX. The 2:1 conversion circuit 804 includes four latch circuits 811, 812, 814, 815 and two pass gates (switches) 813, 816 which are connected as illustrated in FIG. 17B.

In each of the latch circuits 811, 812, 814, 815, a value of an input D is transmitted to an output Q when the inputted clock signal is at a high level, and the value of the input D is latched at falling (at a time of transition from the high level to a low level) of the clock signal, and the output Q is held when the clock signal is at the low level. Each of the pass gates (switches) 813, 816 comes to be ON (continuity state) when an inputted control signal is at a high level, and comes to be OFF (non-continuity state) when the control signal is at a low level. The 2:1 conversion circuit illustrated in FIG. 17B converts 2-bit parallel data D0, D1 into serial data OUT whose data rate is twofold in relation to the parallel data D0, D1, as illustrated in FIG. 17C.

As described above, the conventional multiplexer latches the data of each bit of the inputted parallel data by the latch circuit at falling (or rising) of the clock signal and thereafter outputs via the pass gate which is synchronized with the clock signal, in the 2:1 conversion circuit. For $2^n$-bit parallel data, the conventional multiplexer repeats n-stage data conversion (conversion from 2-bit parallel data to 1-bit serial data) by using a clock signal having been frequency-divided.

In order to realize a high-speed operation in the conventional demultiplexer or multiplexer, a timing accuracy between the clock signal including the frequency divided clock signal and the data signal is important, and highly-accurate timing control is required. Further, when a bit width of data is large, the number of data conversion becomes large due to repetition of data conversion by the conversion circuit, each circuit repeating inversion of an inner potential with a latching action, so that a power consumption becomes large.

There is suggested a semiconductor integrated circuit that includes a first counter which generates a first signal of a cycle obtained by multiplying a clock signal from a rising edge of the clock signal, a second counter which generates a second signal of a cycle obtained by multiplying the clock signal from a falling edge of the clock signal, and an exclusive logical sum operation circuit which generates a clock signal by performing an exclusive logical sum operation of the first signal and the second signal, to output to a circuit unit (see Patent Document 1, for example). This semiconductor integrated circuit is intended to suppress variation of delay time of the clock signal to each circuit, by providing the plurality of exclusive logical sum operation circuits between terminals of a first line to which the first signal is transmitted and a second line to which the second signal is transmitted, and the circuit unit.

[Patent Document 1] Japanese Laid-open Patent Publication No. 2010-41156

SUMMARY

One aspect of a frequency dividing circuit includes: a plurality of latch circuits that are connected in series in a loop in which the latch circuit driven at rising of a clock signal and the latch circuit driven at falling of the clock signal are alternately connected; and a generation circuit configured to generate a plurality of frequency divided clock signals with different phases, based on combinations of levels of outputs of the plurality of latch circuits.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a diagram illustrating a configuration example of a semiconductor integrated circuit in a first embodiment;

FIG. 5 is a diagram illustrating another configuration example of the XOR circuit in the present embodiment;

FIG. 9 is a diagram illustrating a configuration example of a semiconductor integrated circuit in a second embodiment;

FIG. 13 is a diagram illustrating another configuration example of the frequency dividing circuit in the present embodiment;

FIG. 14 is a timing chart illustrating an operation example of the frequency dividing circuit illustrated in FIG. 13;

FIG. 17B is a diagram illustrating a configuration example of a 2:1 conversion circuit; and FIG. 17C is a timing chart illustrating an operation of the 2:1 conversion circuit illustrated in FIG. 17B.

DESCRIPTION OF EMBODIMENTS

Figure 2:
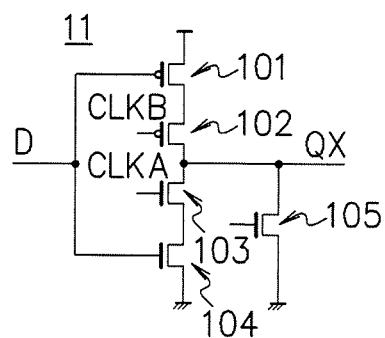
FIG. 2 is a diagram illustrating a configuration example of a latch circuit in the present embodiment.

Hereinafter, embodiments will be described based on the drawings.

First Embodiment

A first embodiment will be described.

FIG. 1 is a diagram illustrating a configuration example of a semiconductor integrated circuit according to the first embodiment. The semiconductor integrated circuit according to the first embodiment is a demultiplexer, and FIG. 1 illustrates a demultiplexer which serial-parallel converts inputted serial data into 4-bit parallel data, as an example.

As illustrated in FIG. 1, the demultiplexer in the first embodiment includes latch circuits 11-0 to 11-7, latch circuits 12-0 to 12-3, exclusive logical sum operation circuits (XOR circuits) 22-0 to 22-3, inverters 21, 23-0 to 23-3, and inverter groups 24-0 to 24-3.

Each of the latch circuits 11-0 to 11-7 through-outputs data inputted to a data input terminal D when a clock signal inputted to a clock terminal is at a high level, and latches the data at falling (transition from the high level to a low level) of the clock signal. An inverting output terminal QX of the latch circuit 11-$i$, "$i$" is a subscript and "$i$" is an integer of 0 to 6", and the data input terminal D of the latch circuit 11-($i$+1) are connected. The inverting output terminal QX of the latch circuit 11-7 and the data input terminal D of the latch circuit 11-0 are connected via the inverter 21. In other words, the latch circuits 11-0 to 11-7 are connected in series in a loop, and the inverter 21 is connected in series to the latch circuits 11-0 to 11-7 connected in the loop.

A clock signal CLK or a clock signal CLKX is inputted to the clock terminals of the latch circuits 11-0 to 11-7. The clock signal CLKX is a clock signal obtained by logically inverting the clock signal CLK. One of the clock signal CLK and the clock signal CLKX is inputted to the clock terminals of latch circuits 11-0, 11-2, 11-4, 11-6, and the other of the clock signal CLK and the clock signal CLKX is inputted to the clock terminals of the latch circuits 11-1, 11-3, 11-5, 11-7.

In other words, in the latch circuits 11-0 to 11-7, the latch circuit which latches data (is driven) in synchronization with either one of rising and falling of the clock signal CLK and the latch circuit which latches data (is driven) in synchronization with the other of rising and falling of the clock signal CLK are connected alternately. FIG. 1 illustrates an example in which the clock signal CLKX is inputted to the clock terminals of the latch circuits 11-0, 11-2, 11-4, 11-6 and the clock signal CLK is inputted to the clock terminals of the latch circuits 11-1, 11-3, 11-5, 11-7.

The XOR circuit 22-0, to which an output (inverted output) n0 of the latch circuit 11-0 and an output (inverted output) n1 of the latch circuit 11-1 are inputted, outputs a result of an exclusive logical sum operation of the above. The inverter 23-0, to which an output of the XOR circuit 22-0 is inputted, logically inverts the above and outputs as a frequency divided clock signal CLK0. The XOR circuit 22-1, to which an output (inverted output) n2 of the latch circuit 11-2 and an output (inverted output) n3 of the latch circuit 11-3 are inputted, outputs a result of an exclusive logical sum operation of the above. The inverter 23-1, to which an output of the XOR circuit 22-1 is inputted, logically inverts the above and outputs as a frequency divided clock signal CLK1.

The XOR circuit 22-2, to which an output (inverted output) n4 of the latch circuit 11-4 and an output (inverted output) n5 of the latch circuit 11-5 are inputted, outputs a result of an exclusive logical sum operation of the above. The inverter 23-2, to which an output of the XOR circuit 22-2 is inputted, logically inverts the above and outputs as a frequency divided clock signal CLK2. The XOR circuit 22-3, to which an output (inverted output) n6 of the latch circuit 11-6 and an output (inverted output) n7 of the latch circuit 11-7 are inputted, outputs a result of an exclusive logical sum operation of the above. The inverter 23-3, to which an output of the XOR circuit 22-3 is inputted, logically inverts the above and outputs as a frequency divided clock signal CLK3.

Each of the latch circuits 12-0 to 12-3 through-outputs data inputted to a data input terminal D when a clock signal inputted to a clock terminal is at a high level, and latches the data at falling (transition from the high level to a low level) of the clock signal. In the latch circuit 12-*j*, "j" is a subscript and "j" is an integer of 0 to 3, input data (serial data) DATA is inputted to the data input terminal D via the inverter group 24-*j*, and the frequency divided clock signal CLKj is inputted to the clock terminal. The latch circuit 12-*j* outputs output data DOUTj in 4-bit parallel data from an output terminal Q.

The demultiplexer in the first embodiment illustrated in FIG. 1 realizes a frequency dividing circuit by a circuit which includes the latch circuits 11-0 to 11-7, the inverter 21, the XOR circuits 22-0 to 22-3, and the inverters 23-0 to 23-3, and generates the frequency divided clock signals CLK0 to CLK3 from the inputted clock signal CLK. The frequency divided clock signals CLK0 to CLK3 are clock signals obtained by frequency-dividing (¼ frequency-dividing) the clock signal CLK into a fourfold cycle. The frequency divided clock signals CLK0 to CLK3 fall in sequence at an interval of one cycle of the clock signal CLK. The frequency divided clock signals CLK0 to CLK3 are inputted to the latch circuits 12-0 to 12-3, and the latch circuits 12-0 to 12-3 latch and output the input data DATA at timings based on the frequency divided clock signals CLK0 to CLK3, whereby the input data DATA is converted into 4-bit output data DOUT0 to DOUT3.

FIG. 2 is a diagram illustrating a configuration example of the latch circuit 11. The latch circuit 11 includes transistors 101, 102, 103, 104, 105. In the P-channel type transistor 101, a source is connected to a supply node of a power supply voltage, a drain is connected to a source of the P-channel type transistor 102, and a gate is connected to the data input terminal D. In the P-channel type transistor 102, a drain is connected to a drain of the N-channel type transistor 103 and a clock signal CLKB is supplied to a gate.

In the N-channel type transistor 103, a source is connected to a drain of the N-channel type transistor 104, and a clock signal CLKA is supplied to a gate. In the N-channel type transistor 104, a source is connected to a supply node of a reference potential and a gate is connected to the data input terminal D. A connection point of the drain of the P-channel type transistor 102 and the drain of the N-channel type transistor 103 is connected to the inverting output terminal QX. The inverting output terminal QX is connected to a supply node of the reference potential via the transistor 105 as a power-down switch. The clock signal CLKA is a clock signal inputted to the clock terminal of the latch circuit 11, and the clock signal CLKB is a signal obtained by logically inverting the above.

In the latch circuit illustrated in FIG. 2, the transistors 102, 103 come to be in ON states and invert an input value of the data input terminal D to output from the inverting output terminal QX when the clock signal CLKA (clock signal inputted to the clock terminal) is at a high level, and the transistors 102, 103 come to be in OFF states when the clock signal CLKA is at a low level. Since each of the latch circuits 11 has only a delay of one stage of the inverter in the present embodiment, a high-speed operation as a frequency dividing circuit is feasible. Note that with regard also to the latch circuits 12-0 to 12-3 illustrated in FIG. 1, it suffices that a configuration is similar to the configuration illustrated in FIG. 2 and that an inverter is added to an output section of the latch circuit to normalize the output.

Figure 3:
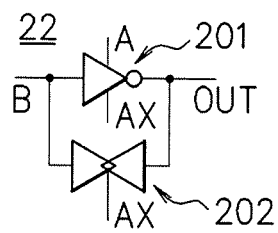
FIG. 3 is a diagram illustrating a configuration example of an XOR circuit in the present embodiment.
Figure 4:
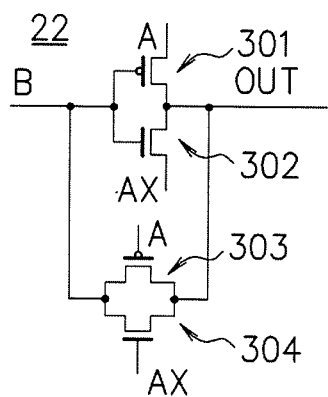
FIG. 4 is a diagram illustrating a circuit configuration example of the XOR circuit in the present embodiment.

FIG. 3 is a diagram illustrating a configuration example of the XOR circuit 22. The XOR circuit 22 includes an inverter 201 and a pass gate (switch) 202. When one input A of the XOR circuit 22 is at a high level, the inverter 201 logically inverts the other input B of the XOR circuit 22 and outputs as an output OUT of the XOR circuit 22. When the one input A of the XOR circuit 22 is at a low level (when an inverted input AX is at a high level), the pass gate 202 comes to be ON (continuity state) and outputs the other input B of the XOR circuit 22 as the output OUT of the XOR circuit 22. FIG. 4 is a diagram illustrating a circuit configuration example of the XOR circuit 22 illustrated in FIG. 3 and the XOR circuit 22 includes four transistors 301 to 304, for example.

The aforementioned XOR circuit 22 has asymmetric loads to the inputs A, B, and a delay of the XOR circuit 22 changes depending on the input value. For example, the delay when the input B is outputted as it is and the delay when the input B is inverted and outputted are different. In the present embodiment, since the XOR circuit 22 detects an output potential (node potential) of the latch circuit 11, it is preferable that the delay and its fluctuation are small in the XOR circuit 22. Though it is possible to realize an XOR circuit by a combination of circuits different from the aforementioned configuration, a circuit configuration becomes asymmetric in general and makes delays different, or a symmetric circuit configuration brings about complexity and makes the delay larger. In contrast, by making a configuration illustrated in FIG. 5, for example, it is possible to realize an XOR circuit 22 in which loads to the inputs A, B are symmetric and a delay is small.

FIG. 5 is a diagram illustrating another configuration example of the XOR circuit 22. The XOR circuit 22 includes transistors 401 to 404, 411 to 414. In the P-channel type transistor 401, a source is connected to a supply node of a power supply voltage, a drain is connected to a source of the P-channel type transistor 402, and an input B of the XOR circuit 22 is inputted to a gate. In the P-channel type transistor 402, a drain is connected to a drain of the N-channel type transistor 403 and an input AX obtained by logically inverting an input A of the XOR circuit 22 is inputted to a gate. In the N-channel type transistor 403, a source is connected to a drain of the N-channel type transistor 404, and the input A of the XOR circuit 22 is inputted to a gate. In the N-channel type transistor 404, a source is connected to a supply node of a reference potential, and the input B of the XOR circuit 22 is inputted to a gate.

In the P-channel type transistor 411, a source is connected to a supply node of the power supply voltage, a drain is connected to a source of the P-channel type transistor 412, and an input BX obtained by logically inverting the input B of the XOR circuit 22 is inputted to a gate. In the P-channel type transistor 412, a drain is connected to a drain of the N-channel type transistor 413, and the input A of the XOR circuit 22 is inputted to a gate. In the N-channel type transistor 413, a source is connected to a drain of the N-channel type transistor 414, and the input AX obtained by logically inverting the input A of the XOR circuit 22 is inputted to a gate. In the N-channel type transistor 414, a source is connected to a supply node of the reference potential, and the input BX obtained by logically inverting the input B of the XOR circuit 22 is inputted to a gate.

A connection point of the drain of the P-channel type transistor 402 and the drain of the N-channel type transistor 403, and a connection point of the drain of the P-channel type transistor 412 and the drain of the N-channel type transistor 413 are connected to an output node of the output OUT of the XOR circuit 22. By configuring the XOR circuit 22 as illustrated in FIG. 5, the loads to the inputs A, B become symmetric, and it becomes possible to operate at a delay amount of two stages of inverters. Thereby, it becomes possible to generate a frequency divided clock signal at an accurate timing in synchronization with falling of the clock signal CLK.

Figure 6:
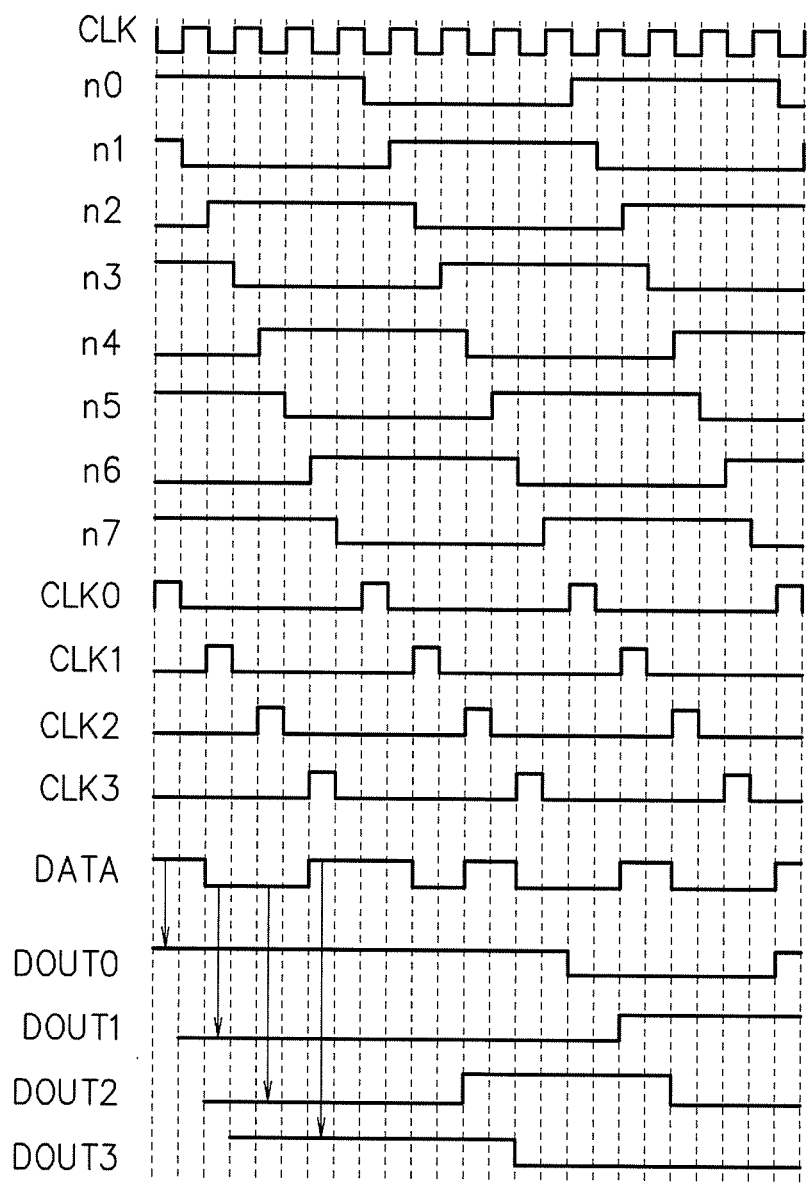
FIG. 6 is a timing chart illustrating an operation example of the semiconductor integrated circuit in the first embodiment.

FIG. 6 is a timing chart illustrating an operation example of the demultiplexer in the first embodiment. As illustrated in FIG. 6, when the clock signal CLK is inputted to the demultiplexer, the latch circuits 11-0 to 11-7 output the outputs n0 to n7 each inverted every four cycles of the clock signal CLK at timings different from each other.

Then, the XOR circuit 22-0 performs the logical operation of the outputs n0, n1 of the adjacent latch circuits 11-0, 11-1, and the inverter 23-0 inverts the output of the XOR circuit 22-0, whereby there is generated the clock signal CLK0 which comes to be at a high level when logical values of the outputs n0, n1 are the same. The XOR circuit 22-1 performs the logical operation of the outputs n2, n3 of the adjacent latch circuits 11-2, 11-3 and the inverter 23-1 inverts the output of the XOR circuit 22-1, whereby there is generated the frequency divided clock signal CLK1 which comes to be at a high level when logical values of the outputs n2, n3 are the same.

Similarly, the XOR circuit 22-2 performs the logical operation of the outputs n4, n5 of the adjacent latch circuits 11-4, 11-5 and the inverter 23-2 inverts the output of the XOR circuit 22-2, whereby there is generated the frequency divided clock signal CLK2 which comes to be at a high level when logical values of the outputs n4, n5 are the same. The XOR circuit 22-3 performs the logical operation of the outputs n6, n7 of the adjacent latch circuits 11-6, 11-7 and the inverter 23-2 inverts the output of the XOR circuit 22-3, whereby there is generated the frequency divided clock signal CLK3 which comes to be at a high level when logical values of the outputs n6, n7 are the same.

The latch circuits 12-0 to 12-3 latch the input data DATA at falling of the supplied frequency divided clock signals CLK0 to CLK3 and output as the output data DOUT0 to DOUT3. As described above, the input data DATA being serial data is converted into the output data DOUT0 to DOUT3 being 4-bit parallel data and outputted.

In the first embodiment, the plurality of latch circuits 11-0 to 11-7 illustrated in FIG. 2 are connected in series in the loop, the outputs n0 to n7 of the latch circuits 11-0 to 11-7 are observed, and the frequency divided clock signals CLK0 to CLK3 whose phases are different from each other are generated based on combinations of levels (potential states, logical values) of the outputs n0 to n7 of the adjacent latch circuits 11-0 to 11-7. In each of the latch circuits 11-0 to 11-7, the output inverts once every four cycles of the clock signal CLK as illustrated in FIG. 6, and thus a power consumption in relation to generation of the frequency divided clock signal is not increased compared with a conventional circuit. Therefore, according to the present embodiment, it becomes possible to generate a frequency divided clock signal which has an accurate timing by a low power consuming circuit configuration. Further, in an operation as the demultiplexer, the number of data conversion is decreased since data conversion as in the conventional circuit is not repeated, and the number of inversion of data is decreased since a chance of inversion of data per one piece of data during the operation is only once at the most, so that the power consumption can be reduced.

Here, the circuit in the present embodiment, in which the frequency dividing circuit and the demultiplexer are integrated, uses the same circuit configuration for each phase from generation of the frequency divided clock signal to latching of the data. On a chip also, by laying out each circuit equally, it is possible to suppress a timing fluctuation between the clock signal including the frequency divided clock signal and a data signal, against a fluctuation of an element characteristic (fluctuation of a delay time) due to a process or a temperature. Further, in the configuration illustrated in FIG. 1, the delay amount of the data signal is adjusted by supplying the input data DATA to the latch circuits 12-0 to 12-3 via the inverter groups 24-0 to 24-3, but it is possible to enlarge a timing margin by making delays of a clock signal and a data signal similar by a configuration illustrated in FIG. 7.

Figure 7:
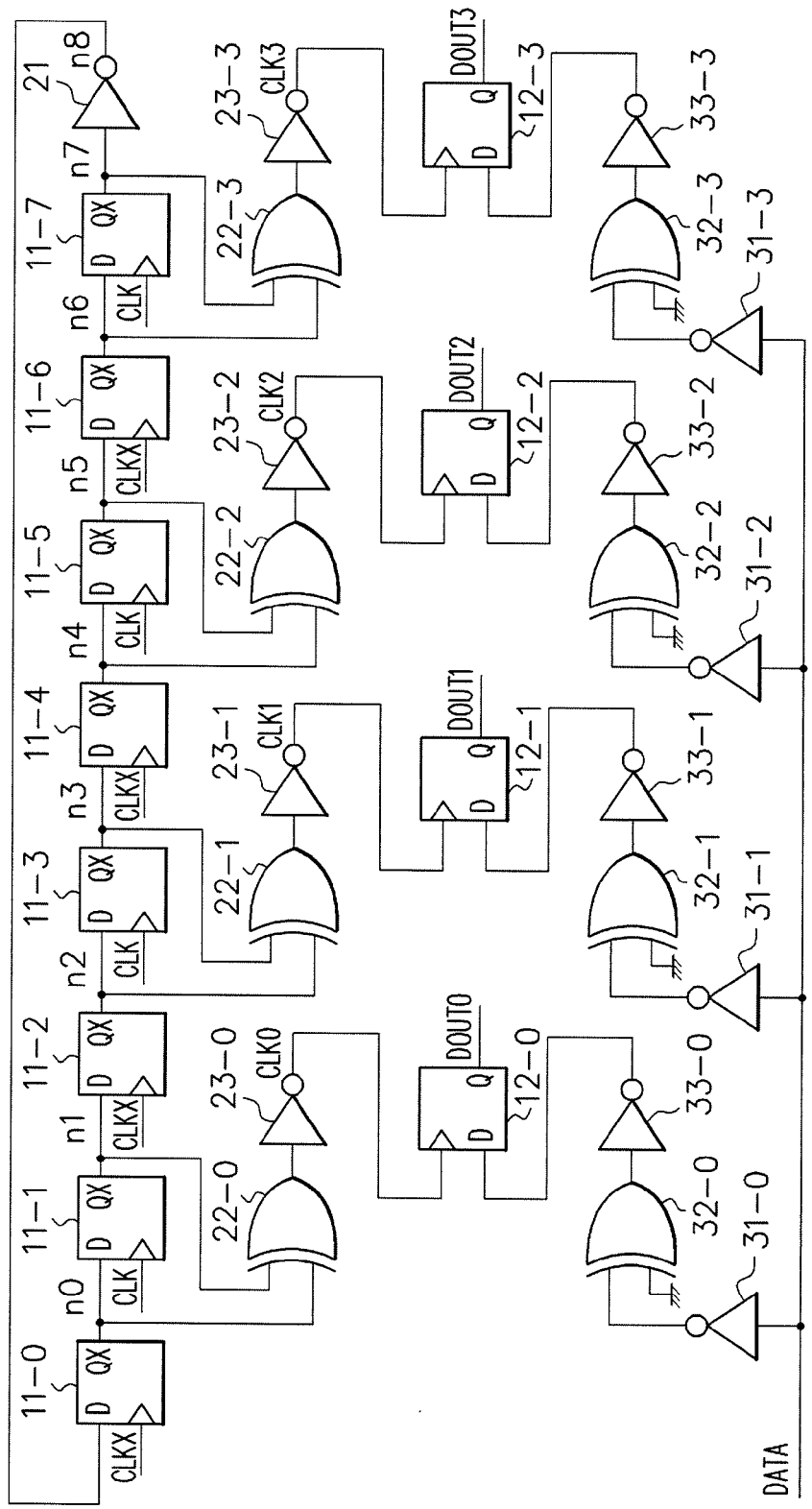
FIG. 7 is a diagram illustrating another configuration example of the semiconductor integrated circuit in the first embodiment.

FIG. 7 is a diagram illustrating another configuration example of the demultiplexer in the first embodiment. In FIG. 7, the same reference numeral is given to a component having the same function as that of a component illustrated in FIG. 1 and redundant explanation will be omitted.

In the demultiplexer illustrated in FIG. 7, input data DATA is supplied to a data input terminal D of a latch circuit 12-0 via an inverter 31-0, an XOR circuit 32-0, and an inverter 33-0 instead of the inverter group 24-0. In latch circuits 12-1 to 12-3 also, the input data DATA is supplied to data input terminals D via inverters 31-1 to 31-3, XOR circuits 32-1 to 32-3, and inverters 33-1 to 33-3, respectively. Note that since one inputs of the XOR circuits 32-0 to 32-3 are at a low level and the inverters 31-0 to 31-3, the XOR circuits 32-0 to 32-3, and the inverters 33-0 to 33-3 are connected in series, data signals which have the same logical values as that of the input data DATA are inputted to the data input terminals D of the latch circuits 12-0 to 12-3.

The configuration is as illustrated in FIG. 7, and each of the clock signals and the data signals is transmitted to the latch circuits 12-0 to 12-3 by one inverter, one XOR circuit, and one inverter. In other words, a part of a circuit configuration of a transmission path of the clock signal to the latch circuits 12-0 to 12-3 is identical with a part of a circuit of a transmission path of the data signal to the latch circuits 12-0 to 12-3. Thereby, it is possible to equalize a delay amount of the transmission path related to the frequency divided clock signals CLK0 to CLK3 inputted to the latch circuits 12-0 to 12-3 and a delay amount of the transmission path related to the input data DATA inputted to the latch circuits 12-0 to 12-3 so that a timing margin can be further enlarged.

Figure 8:
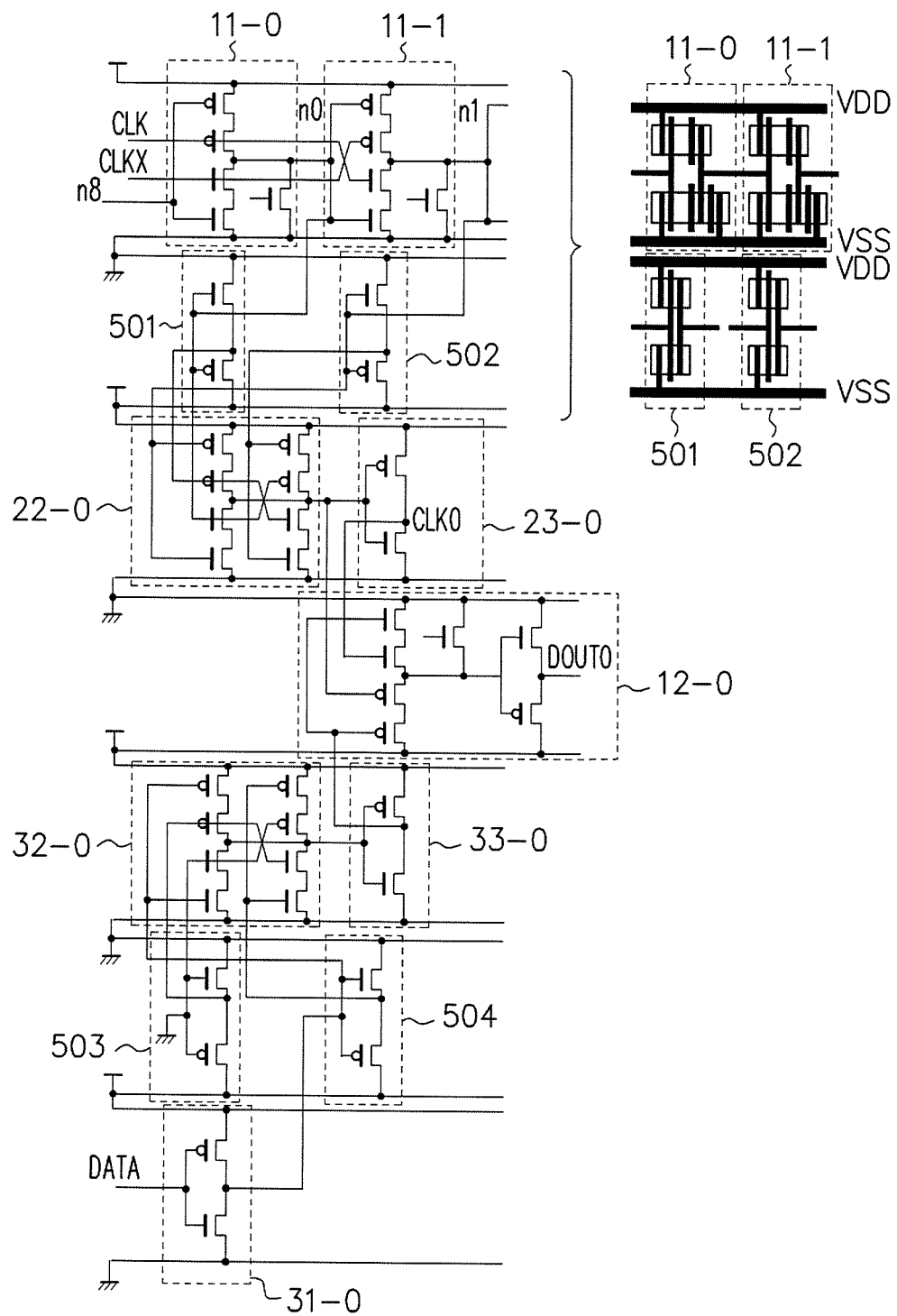
FIG. 8 is a diagram illustrating an example of a circuit configuration and a layout of the semiconductor integrated circuit illustrated in FIG. 7.

FIG. 8 is a diagram illustrating an example of a circuit configuration and a layout of the demultiplexer illustrated in FIG. 7. In FIG. 8, only a configuration related to the output data DOUT0 is illustrated. In FIG. 8, the same reference numeral is given to a component corresponding to the component illustrated in FIG. 7. Inverters 501, 502 are intended for generating a logical inversion signal to be inputted to the XOR circuit 22-0, and inverters 503, 504 are intended for generating a logical inversion signal to be inputted to the XOR circuit 32-0. By laying out the latch circuits 11-0, 11-1 and the inverters 501, 502 as illustrated in upper right, for example, similar layouts are also possible with regard to respective circuit components. As a result that respective circuits are disposed in a manner to make distances of respective paths from inputs of clock signals CLK and inputs from the input data DATA to the latch circuit 12 be equal, a timing accuracy can be improved and a timing margin can be enlarged.

Note that though the demultiplexer in which the inputted serial data is serial-parallel converted into the 4-bit parallel data is represented as the example in the aforementioned explanation, the present embodiment is not limited thereto. It is possible to cope with an arbitrary bit width by properly changing the number of parallels of the latch circuits 11-0 to 11-7, the latch circuits 12-0 to 12-3, the XOR circuits 22-0 to 22-3, and the inverters 23-0 to 23-3 in correspondence with a bit width after serial-parallel conversion.

Second Embodiment

Next, a second embodiment will be described.
FIG. 9 is a diagram illustrating a configuration example of a semiconductor integrated circuit according to the second embodiment. The semiconductor integrated circuit according to the second embodiment is a multiplexer, and FIG. 9 illustrates a multiplexer which parallel-serial converts inputted 4-bit parallel data into serial data, as an example.

As illustrated in FIG. 9, the multiplexer in the second embodiment includes latch circuits 11-0 to 11-3, latch circuits 13-0 to 13-3, latch circuits 14-0 to 14-3, XOR circuits 42-0 to 42-3, inverters 41, 43-0 to 43-3, and pass gates (switches) 44-0 to 44-3.

Each of the latch circuits 11-0 to 11-3 corresponds to the latch circuits 11-0 to 11-3 in the first embodiment respectively, and an inverting output terminal QX of the latch circuit 11-3 and a data input terminal D of the latch circuit 11-0 are connected via the inverter 41. In other words, the latch circuits 11-0 to 11-3 are connected in series in a loop and the inverter 41 is connected in series to the latch circuits 11-0 to 11-3 connected in the loop.

The XOR circuit 42-0, to which an output (inverted output) n0 of the latch circuit 11-0 and an output (inverted output) n1 of the latch circuit 11-1 are inputted, outputs a result of an exclusive logical sum operation of the above. The inverter 43-0, to which an output of the XOR circuit 42-0 is inputted, logically inverts the above and outputs as a frequency divided clock signal CLK0. The XOR circuit 42-1, to which the output (inverted output) n1 of the latch circuit 11-1 and an output (inverted output) n2 of the latch circuit 11-2 are inputted, outputs a result of an exclusive logical sum operation of the above. The inverter 43-1, to which an output of the XOR circuit 42-1 is inputted, logically inverts the above and outputs as a frequency divided clock signal CLK1.

The XOR circuit 42-2, to which the output (inverted output) n2 of the latch circuit 11-2 and an output (inverted output) n3 of the latch circuit 11-3 are inputted, outputs a result of an exclusive logical sum operation of the above. The inverter 43-2, to which an output of the XOR circuit 42-2 is inputted, logically inverts the above and outputs as a frequency divided clock signal CLK2. The XOR circuit 42-3, to which the output (inverted output) n3 of the latch circuit 11-3 and the output (inverted output) n0 of the latch circuit 11-0 are inputted, outputs a result of an exclusive logical sum operation of the above. The inverter 43-3, to which an output of the XOR circuit 42-3 is inputted, logically inverts the above and outputs as a frequency divided clock signal CLK3.

Each of the latch circuits 13-0 to 13-3, 14-0 to 14-3 through-outputs data inputted to a data input terminal D when a clock signal inputted to a clock terminal is at a high level, and latches the data at falling (transition from the high level to a low level) of the clock signal.

In the latch circuit 13-$m$, "m" is a subscript and "m" is an integer of 0 to 3, input data DINm in inputted 4-bit parallel data is inputted to the data input terminal D, and the frequency divided clock signal CLK0 is inputted to the clock terminal. The latch circuit 13-$m$ outputs an output dm from an output terminal Q. In the latch circuit 14-$m$, the output dm of the latch circuit 13-$m$ is inputted to the data input terminal D and the frequency divided clock signal CLKm is inputted to the clock terminal. The latch circuit 14-$m$ outputs an output qm from an output terminal Q.

When an inputted control signal is at a high level, the pass gate 44-$m$ comes to be ON (continuity state), outputs the output qm of the latch circuit 14-$m$ as output data DOUT. When the inputted control signal is at a low level, the pass gate 44-$m$ comes to be OFF (non-continuity state). The frequency divided clock signal CLK1 is inputted to the pass gate 44-0 as the control signal, and the frequency divided clock signal CLK2 is inputted to the pass gate 44-1 as the control signal. The frequency divided clock signal CLK3 is inputted to the pass gate 44-2 as the control signal, and the frequency divided clock signal CLK0 is inputted to the pass gate 44-3 as the control signal. Note that internal configurations of respective circuits such as latch circuits 11-0 to 11-3 and XOR circuits 42-0 to 42-3 are similar to those in the first embodiment.

The multiplexer in the second embodiment illustrated in FIG. 9 realizes a frequency dividing circuit by circuits including the latch circuits 11-0 to 11-3, the inverter 41, the XOR circuits 42-0 to 42-3, and the inverters 43-0 to 43-3, and generates the frequency divided clock signals CLK0 to CLK3 from the inputted clock signal CLK. The frequency divided clock signals CLK0 to CLK3 are clock signals whose pulse widths (periods of being at high levels) are (½) cycles of the clock signal CLK and which are obtained by frequency-dividing (½ frequency-dividing) the clock signal CLK into a twofold cycle. The frequency divided clock signals CLK0 to CLK3 fall in sequence at an interval of (½) cycle of the clock signal CLK.

The frequency divided clock signals CLK0 to CLK3 are inputted to the latch circuits 13-0 to 13-3, 14-0 to 14-3, and the latch circuits 13-0 to 13-3, 14-0 to 14-3 latch input data DIN0 to DIN3 at timings based on the frequency divided clock signals CLK0 to CLK3 and output in sequence via the pass gates 44-0 to 44-3. As described above, the multiplexer illustrated in FIG. 9 converts the 4-bit input data DIN0 to DIN3 into serial output data DOUT.

Figure 10:
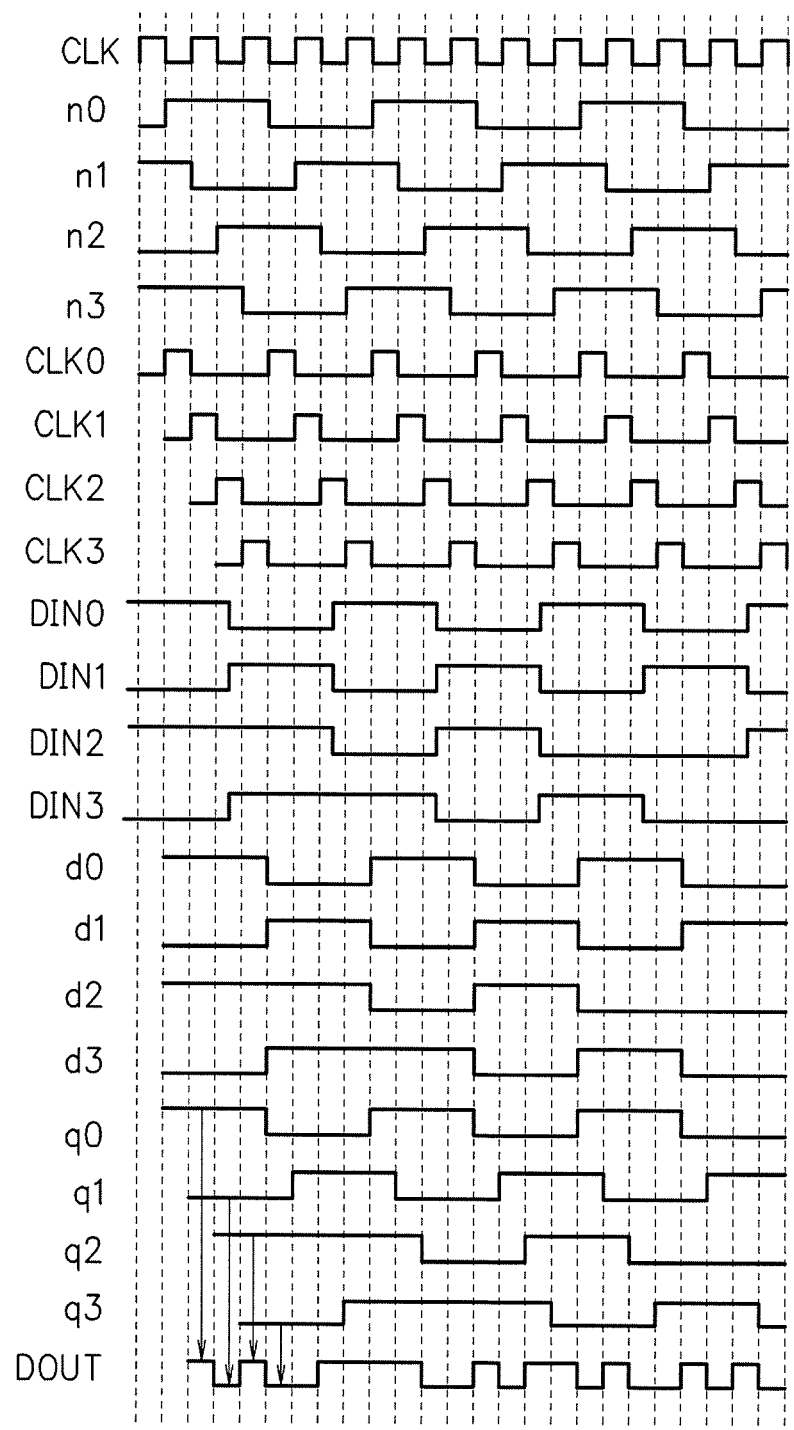
FIG. 10 is a timing chart illustrating an operation example of the semiconductor integrated circuit in the second embodiment.

FIG. 10 is a timing chart illustrating an operation example of the multiplexer in the second embodiment. As illustrated in FIG. 10, when the clock signal CLK is inputted to the multiplexer, the latch circuits 11-0 to 11-3 output the outputs n0 to n3 which are inverted every two cycles of the clock signal CLK at timings different from each other.

The XOR circuit 42-0 performs the logical operation of the outputs n0, n1 of the adjacent latch circuits 11-0, 11-1 and the inverter 43-0 inverts the output of the XOR circuit 42-0, whereby the frequency divided clock signal CLK0 which comes to be at a high level when logical values of the outputs n0, n1 are the same is generated. The XOR circuit 42-1 performs the logical operation of the outputs n1, n2 of the adjacent latch circuits 11-1, 11-2 and the inverter 43-1 inverts the output of the XOR circuit 42-1, whereby the frequency divided clock signal CLK1 which comes to be at a high level when logical values of the outputs n1, n2 are the same is generated.

The XOR circuit 42-2 performs the logical operation of the outputs n2, n3 of the adjacent latch circuits 11-2, 11-3 and the inverter 43-2 inverts the output of the XOR circuit 42-2, whereby the frequency divided clock signal CLK2 which comes to be at a high level when logical values of the outputs n2, n3 are the same is generated. The XOR circuit 42-3 performs the logical operation of the outputs n3, n0 of the adjacent latch circuits 11-3, 11-0 and the inverter 43-3 inverts the output of the XOR circuit 42-3, whereby the frequency divided clock signal CLK3 which comes to be at a high level when logical values of the outputs n3, n0 are the same is generated.

Here, the input data DIN0 to DIN3 are assumed to be inputted at a cycle including a pulse of the frequency divided clock signal CLK0. In other words, the input data DIN0 to DIN3 are assumed not to change during a period (including a falling time thereafter) in which the frequency divided clock signal CLK0 is at the high level. Then, the latch circuits 13-0 to 13-3 latch the input data DIN0 to DIN3 respectively at falling of the supplied frequency divided clock signal CLK0.

Subsequently, the latch circuits 14-0 to 14-3 latch the corresponding outputs d0 to d3 of the latch circuits 13-0 to 13-3 at falling of the supplied frequency divided clock signals CLK0 to CLK3. Therefore, the outputs q0 to q3 of the latch circuits 14-0 to 14-3 are outputted in synchronization with the supplied frequency divided clock signals CLK0 to CLK3.

The outputs q0 to q3 of the latch circuits 14-0 14-3 are outputted as the output data DOUT in correspondence with the frequency divided clock signal of the next phase (for example, the frequency divided clock signal CLK1 in a case of the frequency divided clock signal CLK0) via the pass gates 44-0 to 44-3. As described above, the input data DIN0 to DIN3 being 4-bit parallel data is converted into output data DOUT being serial data and outputted.

According to the second embodiment, similarly to in the first embodiment, it becomes possible to generate a frequency divided clock signal which has an accurate timing by a low power consuming circuit configuration, and the number of data conversion is decreased also in an operation as the multiplexer, so that a power consumption can be reduced.

Further, also in the circuit in the present embodiment, the frequency dividing circuit and the multiplexer are integrated and the same circuit configuration is used for each phase from generation of the frequency divided clock signal to latching and outputting of data. On a chip also, by laying out each circuit equally, it is possible to suppress a timing fluctuation between the clock signal including the frequency divided clock signal and a data signal, against a fluctuation of an element characteristic (fluctuation of a delay time) due to a process or a temperature.

Further, though the multiplexer which parallel-serial converts the inputted 4-bit parallel data into the serial data is described as the example in the aforementioned explanation, the present embodiment is not limited thereto. It is possible to cope with an arbitrary bit width by properly changing the number of parallels of the latch circuits 11-0 to 11-3, the latch circuits 13-0 to 13-3, 14-0 to 14-3, the XOR circuits 42-0 to 42-3, the inverters 43-0 to 43-3, and the pass gates 44-0 to 44-3 in correspondence with a bit width of parallel data to be parallel-serial converted.

Other Embodiments

Hereinafter, other configurations of the frequency dividing circuits in the embodiment will be described.

Figure 11:
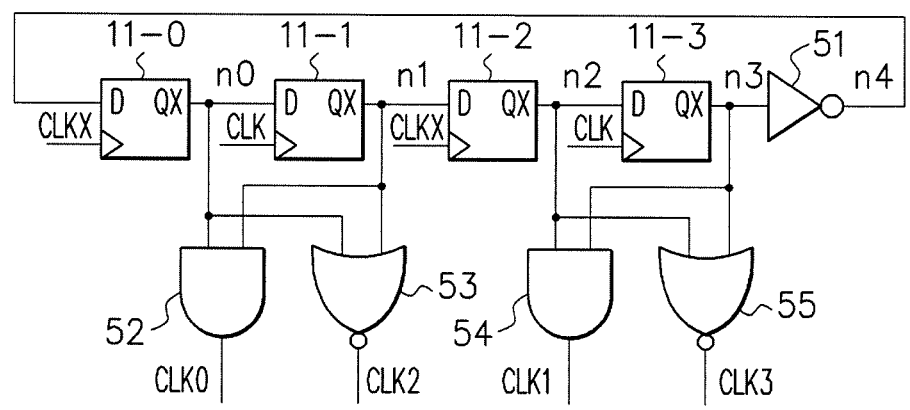
FIG. 11 is a diagram illustrating another configuration example of the frequency dividing circuit in the present embodiment.

FIG. 11 is a diagram illustrating another configuration example of the frequency dividing circuit in the present embodiment. Each of latch circuits 11-0 to 11-3 corresponds to the latch circuits 11-0 to 11-3 in the first embodiment respectively, and an inverting output terminal QX of the latch circuit 11-3 and a data input terminal D of the latch circuit 11-0 are connected via an inverter 51. In other words, the latch circuits 11-0 to 11-3 are connected in series in a loop and the inverter 51 is connected in series to the latch circuits 11-0 to 11-3 connected in the loop.

A logical product operation circuit (AND circuit) 52, to which an output (inverted output) n0 of the latch circuit 11-0 and an output (inverted output) n1 of the latch circuit 11-1 are inputted, outputs a result of a logical product operation of the above as a frequency divided clock signal CLK0. A negative logical sum operation circuit (NOR circuit) 53, to which the output (inverted output) n0 of the latch circuit 11-0 and the output (inverted output) n1 of the latch circuit 11-1 are inputted, outputs a result of a negative logical sum operation of the above as a frequency divided clock signal CLK2.

An AND circuit 54, to which an output (inverted output) n2 of the latch circuit 11-2 and an output (inverted output) n3 of the latch circuit 11-3 are inputted, outputs a result of a logical product operation of the above as a frequency divided clock signal CLK1. A NOR circuit 55, to which the output (inverted output) n2 of the latch circuit 11-2 and the output (inverted output) n3 of the latch circuit 11-3 are inputted, outputs a result of a negative logical sum operation of the above as a frequency divided clock signal CLK3.

Figure 12:
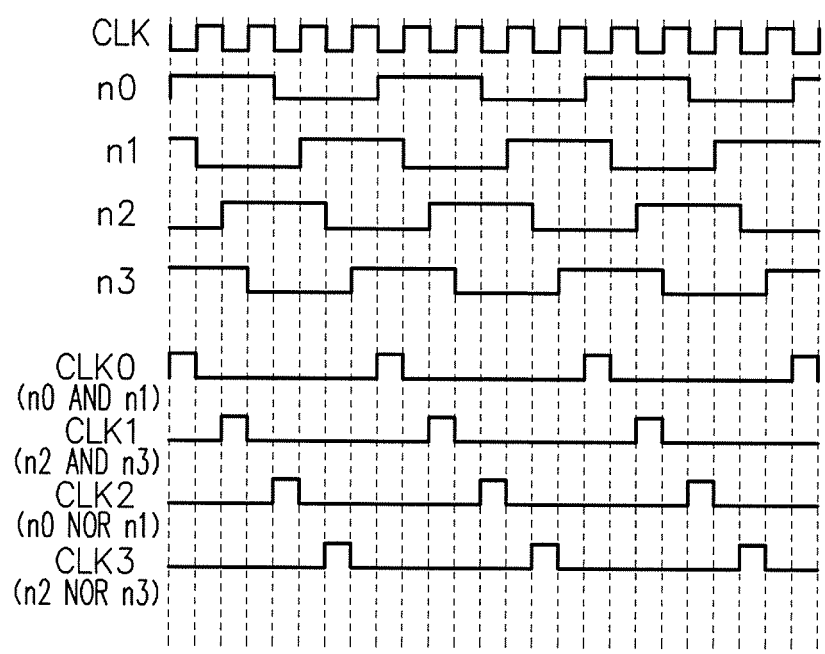
FIG. 12 is a timing chart illustrating an operation example of the frequency dividing circuit illustrated in FIG. 11.
Figure 15:
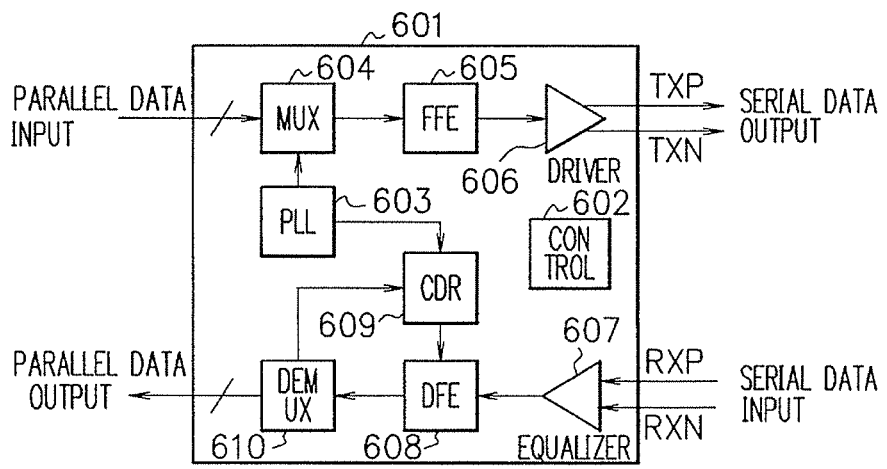
FIG. 15 is a diagram illustrating a configuration example of a serializer/deserializer.
Figure 16A:
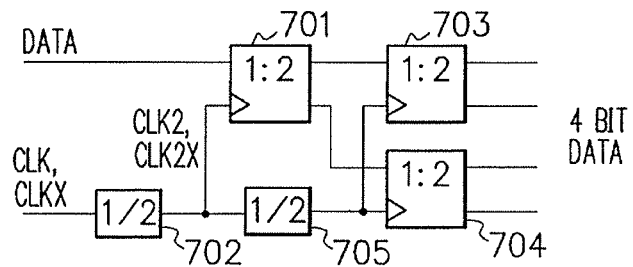
FIG. 16A is a diagram illustrating a configuration example of a conventional demultiplexer.
Figure 16B:
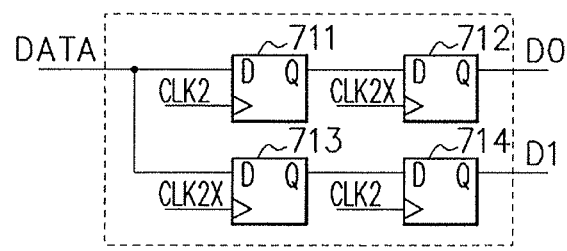
FIG. 16B is a diagram illustrating a configuration example of a 1:2 conversion circuit.
Figure 16C:
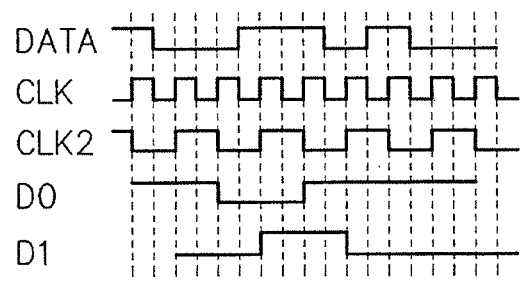
FIG. 16C is a timing chart illustrating an operation of the 1:2 conversion circuit illustrated in FIG. 16B.
Figure 17A:
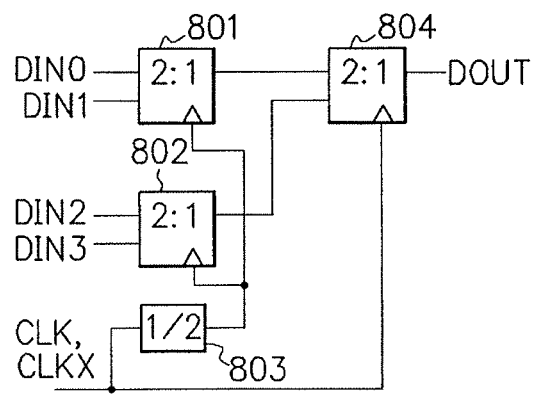
FIG. 17A is a diagram illustrating a configuration example of a conventional multiplexer.

According to the frequency dividing circuit illustrated in FIG. 11, it is possible to generate the frequency divided clock signals CLK0 to CLK3 similar to those in the first embodiment as illustrated in FIG. 12 by a configuration different from the configuration illustrated in the first embodiment. Note that in the configuration illustrated in FIG. 11, since pulses are generated in both of rising and falling of an inputted clock signal, a duty of the inputted clock signal is 50%.

Further, the frequency dividing circuit in the present embodiment can generate not only a frequency divided clock signal frequency-divided by an even number but also a frequency divided clock signal frequency-divided by an odd number or frequency-divided in units of 0.5. FIG. 13 is a diagram illustrating another configuration example of the frequency dividing circuit in the present embodiment, and there is illustrated a frequency dividing circuit which generates a frequency divided clock signal CLK3 obtained by ⅓ frequency dividing an inputted clock signal CLK and a frequency divided clock signal CLK 15 obtained by 1/1.5 frequency dividing the inputted clock signal CLK, as an example.

Each of the latch circuits 11-0 to 11-5 corresponds to the latch circuits 11-0 to 11-5 in the first embodiment respectively, and an inverting output terminal QX of the latch circuit 11-5 and a data input terminal D of the latch circuit 11-0 are connected via an inverter 61. In other words, the latch circuits 11-0 to 11-5 are connected in series in a loop and the inverter 61 is connected in series to the latch circuits 11-0 to 11-5 connected in the loop.

An XOR circuit 62, to which an output (inverted output) n0 of the latch circuit 11-0 and an output (inverted output) n3 of the latch circuit 11-3 are inputted, outputs a result of an exclusive logical sum operation of the above as a frequency divided clock signal CLK3 of ⅓ frequency division. An XOR circuit 63, to which the output (inverted output) n0 of the latch circuit 11-0 and an output (inverted output) n1 of the latch circuit 11-1 are inputted, outputs a result of an exclusive logical sum operation of the above. An XOR circuit 64, to which the output (inverted output) n3 of the latch circuit 11-3 and an output (inverted output) n4 of the latch circuit 11-4 are inputted, outputs a result of an exclusive logical sum operation of the above. An XOR circuit 65, to which an output q0 of the XOR circuit 63 and an output q1 of the XOR circuit 64 are inputted, outputs a result of an exclusive logical sum operation of the above as a frequency divided clock signal CLK 15 of 1/1.5 frequency division.

FIG. 14 is a timing chart illustrating an operation example of the frequency dividing circuit illustrated in FIG. 13. As illustrated in FIG. 14, when the clock signal CLK is inputted, the latch circuits 11-0 to 11-5 output the outputs n0 to n5 which are inverted every three cycles of the clock signal CLK at different timings from each other. As a result that the XOR circuit 62 performs the logical operation of the outputs n0, n3 of the latch circuits 11-0, 11-3, the frequency divided clock signal CLK3 of ⅓ frequency division is generated.

As a result that the XOR circuit 63 performs the logical operation of the outputs n0, n1 of the latch circuits 11-0, 11-1, the XOR circuits 63 outputs the output q0 which comes to be at a low level when logical values of the outputs n0, n1 are the same. As a result that the XOR circuit 64 performs the logical operation of the outputs n3, n4 of the latch circuits 11-3, 11-4, the XOR circuit 64 outputs the output q1 which comes to be at a low level when logical values of the outputs n3, n4 are the same. As a result that the XOR circuit 65 performs the logical operation of the outputs q0, q1 of the XOR circuits 63, 64, the frequency divided clock signal CLK 15 of 1/1.5 frequency division which rises (or falls) every 1.5 cycles of the clock signal CLK is generated.

As described above, according to the present embodiment, by properly selecting the number of the latch circuits of the frequency dividing circuit or a combination of outputs (nodes) of the latch circuits used for generation of the frequency divided clock signal, an arbitrary frequency divided clock signal can be generated. The frequency dividing circuit in the present embodiment can be used, for example, in a frequency divider in a phase locked loop (PLL) circuit, in a case where a frequency of a clock signal is converted and supplied to another circuit, and so on.

Further, all the aforementioned embodiments merely illustrate concrete examples of implementing the present invention and are not intended to limit the interpretation of the technical scope of the present invention. In other words, the present invention can be implemented in various manners without departing from the technical spirits or main features thereof.

A disclosed frequency dividing circuit can generate frequency divided clock signals which have accurate timings by a low power consuming circuit configuration, as a result of alternately connecting latch circuits driven at rising or falling of a clock signal and generating a plurality of frequency divided clock signals whose phases are different based on combinations of levels of outputs of the plurality of latch circuits. By using the disclosed frequency dividing circuit, it is possible to provide a demultiplexer or a multiplexer in which a power consumption is reduced.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A frequency dividing circuit comprising:
   a plurality of latch circuits that include a first plurality of latch circuits driven at a rising of a clock signal and a second plurality of latch circuits driven at a falling of the clock signal, the plurality of latch circuits being connected to each other in series connection in a loop in which each of the first plurality of latch circuits driven at the rising of the clock signal is connected to an adjacent one of the second plurality of latch circuits driven at the falling of the clock signal, such that each of the first plurality and the second plurality of latch circuits are alternately connected to one another and in which a data output node of a prior stage latch circuit is connected to a data input node of a subsequent stage latch circuit that is subsequent to the prior stage latch circuit; and
   a generation circuit configured to generate each of a plurality of frequency divided clock signals with different phases, based on combinations of levels of outputs of a pair of a first latch circuit driven at the rising of the clock signal and a second latch circuit driven at the falling of the clock signal, the first latch circuit and the second latch circuit being adjacent to each other, among the plurality of latch circuits.

2. The frequency dividing circuit according to claim 1, wherein the generation circuit is configured to generate each of the plurality of frequency divided clock signals by performing a logical operation of outputs of the adjacent latch circuits among the plurality of latch circuits.

3. The frequency dividing circuit according to claim 1,
wherein the latch circuit driven at the rising of the clock signal is an inverter configured to come to be in a continuity state when the clock signal is at a low level and to come to be in a non-continuity state when the clock signal is at a high level, and
wherein the latch circuit driven at the falling of the clock signal is an inverter configured to come to be in a continuity state when the clock signal is at the high level and to come to be in a non-continuity state when the clock signal is at the low level.

4. The frequency dividing circuit according to claim 3,
wherein the inverter includes a first P-channel type transistor, a second P-channel type transistor, a first N-channel type transistor, and a second N-channel type transistor that are connected in series in an order thereof between a supply node of a power supply voltage and a supply node of a reference potential,
wherein gate of one transistor of the first P-channel type transistor and the second P-channel type transistor is connected to a data input terminal of the latch circuit,
wherein the clock signal or a logically inverted signal of the clock signal is supplied to gate of another transistor of the first P-channel type transistor and the second P-channel type transistor,
wherein gate of one transistor of the first N-channel type transistor and the second N-channel type transistor is connected to the data input terminal of the latch circuit, and
wherein the clock signal or the logically inverted signal of the clock signal is supplied to gate of another transistor the first N-channel type transistor and the second N-channel type transistor.

5. The frequency dividing circuit according to claim 1, wherein:
the generation circuit includes a plurality of exclusive logical sum operation circuits configured to generate the plurality of frequency divided clock signals with different phases by performing logical operations of outputs of the adjacent latch circuits among the plurality of latch circuits, and
each of exclusive logical sum operation circuits includes two inverters connected in parallel, the two inverters configured to operate selectively in correspondence with one input of the exclusive logical sum operation circuit and to invert and output another input of the exclusive logical sum operation circuit.

6. The frequency dividing circuit according to claim 1, wherein the generation circuit configured to generate, as at least one of the plurality of frequency divided clock signals, a frequency divided clock signal whose cycle being an odd-multiple cycle of a cycle of the clock signal or an odd-multiple cycle of (½) cycle of the clock signal, by performing a plurality of stages of logical operations of combinations of levels of the outputs of the plurality of latch circuits.

7. A semiconductor integrated circuit comprising:
a plurality of latch circuits that include a first plurality of latch circuits driven at a rising of a clock signal and a second plurality of latch circuits driven at a falling of the clock signal, the latch circuits being connected to each other in series connection in a loop in which each of the first plurality of latch circuits driven at the rising of the clock signal is connected to an adjacent one of the second plurality of latch circuits driven at the falling of the clock signal, such that each of the first plurality and the second plurality of latch circuits are alternately connected to one another and in which a data output node of a prior stage latch circuit is connected to a data input node of a subsequent stage latch circuit that is subsequent to the prior stage latch circuit;
a generation circuit configured to generate each of a plurality of frequency divided clock signals with different phases, based on combinations of levels of outputs of a pair of a first latch circuit driven at the rising of the clock signal and a second latch circuit driven at the falling of the clock signal, the first latch circuit and the second latch circuit being adjacent to each other, among the plurality of latch circuits; and
a conversion circuit configured to serial-parallel convert and output inputted serial data based on the plurality of frequency divided clock signals.

8. The semiconductor integrated circuit according to claim 7, wherein the conversion circuit includes a plurality of latch circuits configured to receive different ones of the plurality of frequency divided clock signals, respectively, each of the plurality of latch circuits being configured to latch and output the serial data based on the received frequency divided clock signal.

9. The semiconductor integrated circuit according to claim 8, wherein a part of a circuit configuration of a transmission path of the frequency divided clock signal to the latch circuit and a part of a circuit configuration of a transmission path of the serial data to the latch circuit are identical.

10. The semiconductor integrated circuit according to claim 7, further comprising a processing circuit configured to process output data of the conversion circuit by using one or more frequency divided clock signals generated by the generation circuit.

11. A semiconductor integrated circuit comprising:
a plurality of latch circuits that includes a first plurality of latch circuits driven at a rising of a clock signal and a second plurality of latch circuits driven at a falling of the clock signal, the latch circuits being connected to each other in series connection in a loop in which each of the first plurality of latch circuits driven at the rising of the clock signal is connected to an adjacent one of the second plurality of latch circuits driven at the falling of the clock signal, such that each of the first plurality and the second plurality of latch circuits are alternately connected to one another and in which a data output node of a prior stage latch circuit is connected to a data input node of a subsequent stage latch circuit that is subsequent to the prior stage latch circuit;
a generation circuit configured to generate each of a plurality of frequency divided clock signals with different phases, based on combinations of levels of outputs of a pair of a first latch circuit driven at the rising of the clock signal and a second latch circuit driven at the falling of the clock signal, the first latch circuit and the second latch circuit being adjacent to each other among, the plurality of latch circuits; and a conversion circuit configured to parallel-serial convert and output inputted parallel data based on the plurality of frequency divided clock signals.

12. The semiconductor integrated circuit according to claim 11, wherein the conversion circuit includes:
   a plurality of latch circuits configured to latch the parallel data by different ones of the plurality of frequency divided clock signals, respectively, and
   a plurality of pass gates configured to output outputs of the plurality of latch circuits based on different ones of the plurality of frequency divided clock signals, respectively.

13. The semiconductor integrated circuit according to claim 11, further comprising a processing circuit configured to output the inputted parallel data by using one or more frequency divided clock signals generated by the generation circuit.

* * * * *